United States Patent
Dumchin et al.

(10) Patent No.: US 9,825,638 B2
(45) Date of Patent: Nov. 21, 2017

(54) VIRTUAL CRITICAL PATH (VCP) SYSTEM AND ASSOCIATED METHODS

(71) Applicant: SanDisk Technologies LLC, Plano, TX (US)

(72) Inventors: Yan Dumchin, Beer Sheva (IL); Yair Baram, Meitar (IL); Michael Tomashev, Ashdod (IL); Leonid Minz, Beer Sheva (IL); Yevgeny Kaplan, Beer Sheva (IL); Suzanna Zilberman, Beer Sheva (IL)

(73) Assignee: Sandisk Technologies LLC, Plano, TX (US)

( * ) Notice: Subject to any disclaimer, the term of this patent is extended or adjusted under 35 U.S.C. 154(b) by 574 days.

(21) Appl. No.: 14/198,374

(22) Filed: Mar. 5, 2014

(65) Prior Publication Data

US 2015/0254384 A1 Sep. 10, 2015

(51) Int. Cl.
| | |
|---|---|
| *G06F 9/455* | (2006.01) |
| *G06F 17/50* | (2006.01) |
| *H03L 7/07* | (2006.01) |
| *G01R 31/28* | (2006.01) |
| *G06F 1/08* | (2006.01) |
| *G06F 1/32* | (2006.01) |
| *G06F 1/20* | (2006.01) |

(52) U.S. Cl.
CPC ............... *H03L 7/07* (2013.01); *G01R 31/28* (2013.01); *G06F 1/08* (2013.01); *G06F 1/324* (2013.01); *G06F 1/3296* (2013.01); *G06F 1/206* (2013.01); *Y02B 60/1217* (2013.01); *Y02B 60/1285* (2013.01)

(58) Field of Classification Search
USPC ........................................ 716/134
See application file for complete search history.

(56) References Cited

U.S. PATENT DOCUMENTS

| 7,116,142 B2 | 10/2006 | Ferraiolo et al. |
| 7,260,754 B2 | 8/2007 | Lee |
| 2005/0039094 A1 | 2/2005 | Yan |
| 2005/0193299 A1 | 9/2005 | Saado et al. |

(Continued)

FOREIGN PATENT DOCUMENTS

| WO | WO 2006/052929 | 5/2006 |
| WO | WO 2010/087817 | 8/2010 |

*Primary Examiner* — Eric Lee
(74) *Attorney, Agent, or Firm* — Stoel Rives LLP (57) ABSTRACT

A virtual critical path (VCP) circuit is defined separate from an actual critical path circuit. The VCP operates in accordance with a special clock signal. The actual critical path circuit operates in accordance with a system clock signal. The VCP circuit has a signal timing characteristic substantially equal to that of the actual critical path circuit. The VCP circuit includes computational circuitry defined to compute an output value based on an input value, and comparison circuitry defined to compare the output value with an expected result value. A match between the output value computed by the VCP circuit and the expected result value indicates that a frequency of the special clock signal is acceptable. The VCP circuit is used to determine a maximum acceptable frequency of the special clock signal. A frequency of the system clock signal is then set to the maximum acceptable frequency of the special clock signal.

20 Claims, 4 Drawing Sheets

(56) References Cited

U.S. PATENT DOCUMENTS

| | | |
|---|---|---|
| 2008/0301601 A1* | 12/2008 | Ng |
| 2010/0017042 A1 | 1/2010 | Lopata |
| 2010/0287432 A1 | 11/2010 | Visweswariah et al. |
| 2011/0068858 A1 | 3/2011 | Chawla et al. |
| 2012/0159276 A1 | 6/2012 | Zandian et al. |
| 2014/0167812 A1* | 6/2014 | Jain ..................... H03K 19/003 326/16 |

* cited by examiner

VIRTUAL CRITICAL PATH (VCP) SYSTEM AND ASSOCIATED METHODS

BACKGROUND

Electronic devices include many different integrated circuits corresponding to different data paths, where each data path extends between a respective input node and a respective output node. A given data path within an integrated circuit that has the maximum delay between receipt of a signal at its input node and generation of a signal at its output node is referred to as a critical path of the integrated circuit. There can be many critical paths in a given integrated circuit.

A static timing analysis (STA) tool is used to identify critical paths within the integrated circuit through simulated operation of the integrated circuit. The STA tool can also determine a maximum clock frequency at which the integrated circuit can operate given the signal delay characteristics of the critical path(s) of the integrated circuit. However, because the STA tool relies upon simulation of the integrated circuit operation, various assumptions that affect timing performance of the integrated circuit must be made in modeling the integrated circuit in the STA tool. These assumptions are often made in a conservative manner with respect to determining the maximum clock frequency at which the integrated circuit can successfully operate. For example, the STA tool can apply many margins on various parameters such as fabrication process variation, operating temperature, operating voltage, among others. Therefore, the as-fabricated integrated circuit often performs better than the integrated circuit as simulated in the STA tool. Thus, the maximum clock frequency determined by the STA tool may include excess margin.

Due to the margin in the STA analysis, it may be possible to operate the as-fabricated integrated circuit at a higher clock frequency that the maximum clock frequency determined by the STA tool. However, if the clock frequency of the real-world integrated circuit is increased too much, the circuit can operate incorrectly. It is within this context that the present invention arises.

SUMMARY

In one embodiment, a semiconductor chip includes a critical path circuit and a virtual critical path circuit. The critical path circuit is defined to operate in accordance with a system clock signal. The critical path circuit has a critical path signal timing characteristic. The virtual critical path circuit is defined to operate in accordance with a special clock signal. The virtual critical path circuit is defined separate from the critical path circuit. The special clock signal is generated separate from the system clock signal. The virtual critical path circuit is defined to have a virtual critical path signal timing characteristic substantially equal to the critical path signal timing characteristic. The virtual critical path circuit includes computational circuitry defined to compute an output value based on an input value. The virtual critical path circuit includes comparison circuitry defined to compare the output value computed by the computational circuitry with an expected result value associated with the input value. A match between the output value computed by the computational circuitry and the expected result value indicates that a frequency of the special clock signal is acceptable. A difference between the output value computed by the computational circuitry and the expected result value indicates that the frequency of the special clock signal is not acceptable.

In one embodiment, a virtual critical path circuit is disclosed. The virtual critical path circuit includes an input register for storing a programmable input value. The virtual critical path circuit also includes computational circuitry defined to perform mathematical operations on the input value. The computational circuitry is defined to operate in accordance with a special clock signal. The special clock signal is generated separate from a system clock signal. The computational circuitry is defined to have a signal timing characteristic substantially equivalent to a signal timing characteristic of a critical path circuit defined to operate in accordance with the system clock signal. The virtual critical path circuit also includes an output register for storing an output value generated by the computational circuitry. The virtual critical path circuit also includes comparison circuitry defined to compare the output value to an expected result value to determine if the output value is correct. A correct output value indicates that a frequency of the special clock signal is acceptable. An incorrect output value indicates that the frequency of the special clock signal is not acceptable.

In one embodiment, a method is disclosed for real-time system clock optimization. The method includes operating computational circuitry to compute an output value based on an input value. The computational circuitry is operated in accordance with a special clock signal. The computational circuitry has a signal timing characteristic substantially equivalent to a signal timing characteristic of a critical path circuit defined to operate in accordance with a system clock signal. The special clock signal is generated separate from the system clock signal. And, the computational circuitry is operated independent from the critical path circuit. The method also includes comparing the output value with an expected result value to determine if the output value is correct. A correct output value indicates that a frequency of the special clock signal is acceptable. An incorrect output value indicates that the frequency of the special clock signal is not acceptable. The method also includes adjusting a frequency of the system clock signal to match an acceptable frequency of the special clock signal.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

A static timing analysis (STA) tool can be used to identify a critical path circuit within an integrated circuit and determine the maximum clock frequency at which the critical path circuit can correctly operate. However, the STA tool includes margin in determining the maximum clock frequency for the critical path. Therefore, the as-fabricated integrated circuit can often operate at a higher maximum clock frequency than that determined by the STA tool. A virtual critical path (VCP) circuit, system, and associated methods are disclosed herein for in-situ determination of the maximum clock frequency at which the as-fabricated integrated circuit can correctly operate, without impacting normal operation of the integrated circuit, and without significantly impacting a layout of the integrated circuit, i.e., without consuming excessive chip area.

Figure 1:
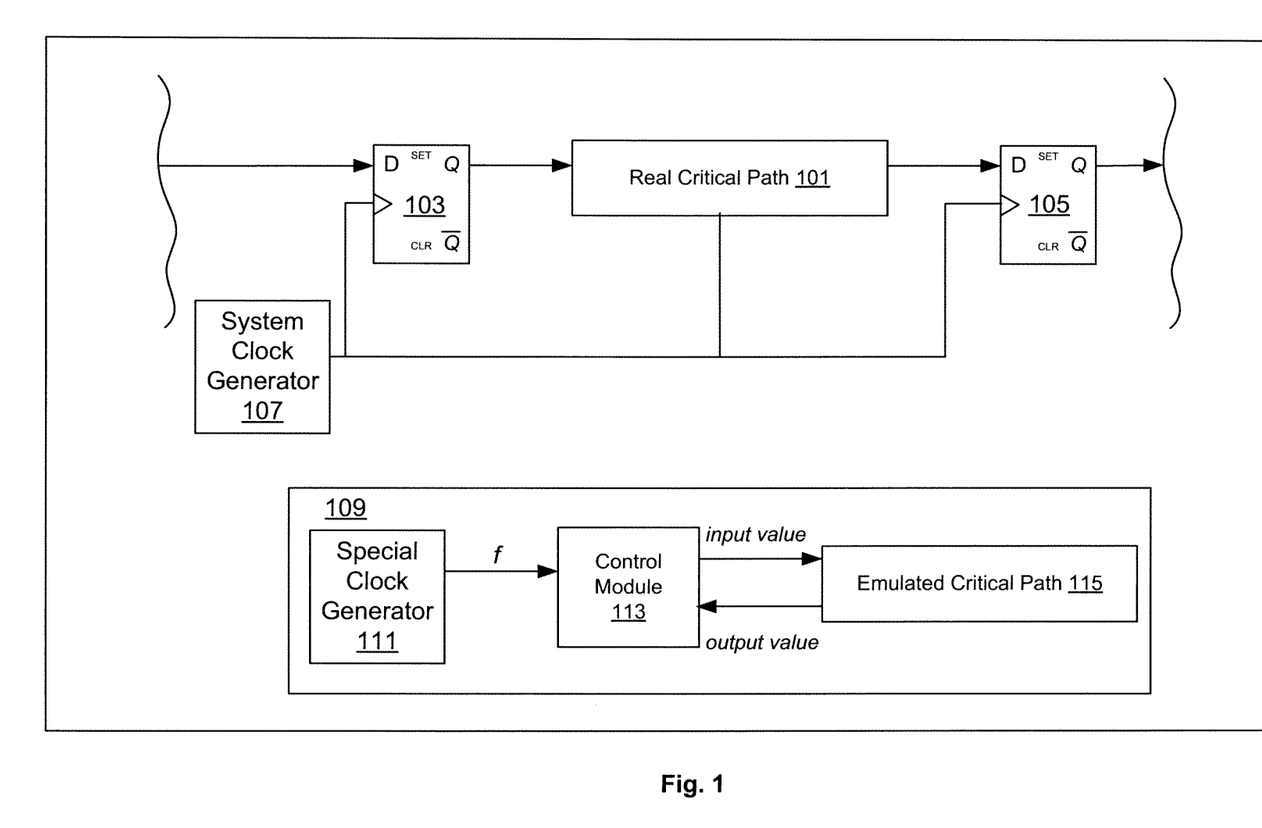
FIG. 1 shows a diagram representing an actual critical path circuit and a corresponding VCP system, in accordance with one embodiment of the present invention.

FIG. 1 shows a diagram representing an actual critical path circuit 101 and a corresponding VCP system 109, in accordance with one embodiment of the present invention. The actual critical path circuit 101 is represented as a data path defined between an input latch 103 and an output latch 105. The actual critical path circuit 101, the input latch 103, and the output latch 105 operate in accordance with a system clock signal generated by a system clock generator 107. The actual critical path 101 has an associated signal timing characteristic that manifests as a time delay from clocking out of a data signal at the input latch 103 to clocking in of a data signal at the output latch 105. The frequency of the clock signal at which the actual critical path 101 operates must not exceed a signal propagation capability of the actual critical path 101. In other words, as a data signal propagates through the actual critical path 101, the frequency of the system clock signal must allow for arrival/setup of an appropriate data signal at each circuit element within the actual critical path 101 before triggering propagation of the data signal through the circuit element.

The VCP system 109 includes a special clock generator 111 defined separate from the system clock generator 107. The VCP system 109 also includes a control module 113 and an emulated critical path 115, both of which operate in accordance with a special clock signal generated by the special clock generator 111. The emulated critical path 115 is a combination of logic elements (e.g., adder, divider, multiplier, square root, etc.) that together emulate the timing characteristics of the actual critical path 101. In one embodiment, the STA tool can be used to determine a combination of logic elements for the emulated critical path 115 that has a signal timing characteristic, e.g., timing delay, substantially equal to the signal timing characteristic of the actual critical path 101.

It should be understood that the emulated critical path 115 is defined separate from the actual critical path 101 and is operated independent of the actual critical path 101. The emulated critical path 115 is defined to receive a data value as an input value, perform operations (add, divide, multiply, square root, etc.) on the data value, and generate a corresponding output value. The operations performed by the emulated critical path 115 are known by the VCP user. Therefore, for a given input value supplied to the emulated critical path 115, the expected output value to be generated by the emulated critical path 115 is known. Because the signal delay characteristics of the emulated critical path 115 are substantially equivalent to the signal delay characteristics of the actual critical path 101, signal timing performance of the emulated critical path 115 is representative of the signal timing performance of the actual critical path 101.

Because the actual critical path 101 can be very complicated and can involve many different blocks of the chip, use of a clone of the actual critical path 101 to test clock signal adjustments may not be feasible or practical. Therefore, it should be appreciated that the emulated critical path 115 provides a means for in-situ testing of clock signal adjustments without the burden of identical cloning of the actual critical path 101.

To the extent possible, the emulated critical path 115 is located near the actual critical path 115 on the semiconductor chip such that the emulated critical path 115 and the actual critical path 115 are subject to similar process variation during manufacture, and such that the emulated critical path 115 and the actual critical path 101 are subject to similar voltage and temperature during operation of the semiconductor chip. Therefore, the VCP system 109 can be operated to emulate the actual critical path 101 on the as-fabricated chip during actual use conditions to determine the maximum system clock frequency at which the chip can operate. More specifically, the frequency of the special clock signal can be increased using the special clock generator 111 while processing data through the emulated critical path 115 and with checking of the resulting output value to determine a maximum frequency of the special clock signal at which the emulated critical path 115 functions properly. The frequency of the special clock signal can be increased until the arithmetical operation result of the emulated critical path 115 logic is incorrect, thereby indicating that the maximum frequency of the special clock signal has been reached.

Because the signal timing characteristics of the emulated critical path 115 substantially match the signal timing characteristics of the actual critical path 101, there is confidence that the maximum frequency of the special clock signal is also the maximum frequency of the system clock signal at which the actual critical path 101 will operate correctly. Then, based on the maximum frequency of the special clock signal as determined by the VCP system 109, the system clock generator 107 can be operated to safely increase the frequency of the system clock signal to boost performance of the integrated circuit.

In the case where the integrated circuit includes multiple critical paths, the VCP system 109 can include a separate emulated critical path 115 for each of the multiple critical paths. And, each of the separate emulated critical paths can be independently operated/controlled. Operation of the VCP system 109 does not interfere with operation of the actual integrated circuit. It should be appreciated that the VCP system 109 can be operated in parallel with the integrated circuit that includes the actual critical path 101. And, it should be appreciated that because the emulated critical path 115 of the VCP system 109 is defined on the chip near the actual critical path 101, the emulated critical path 115 will operated under essentially the same conditions of voltage and temperature as the actual critical path 101.

Figure 2:
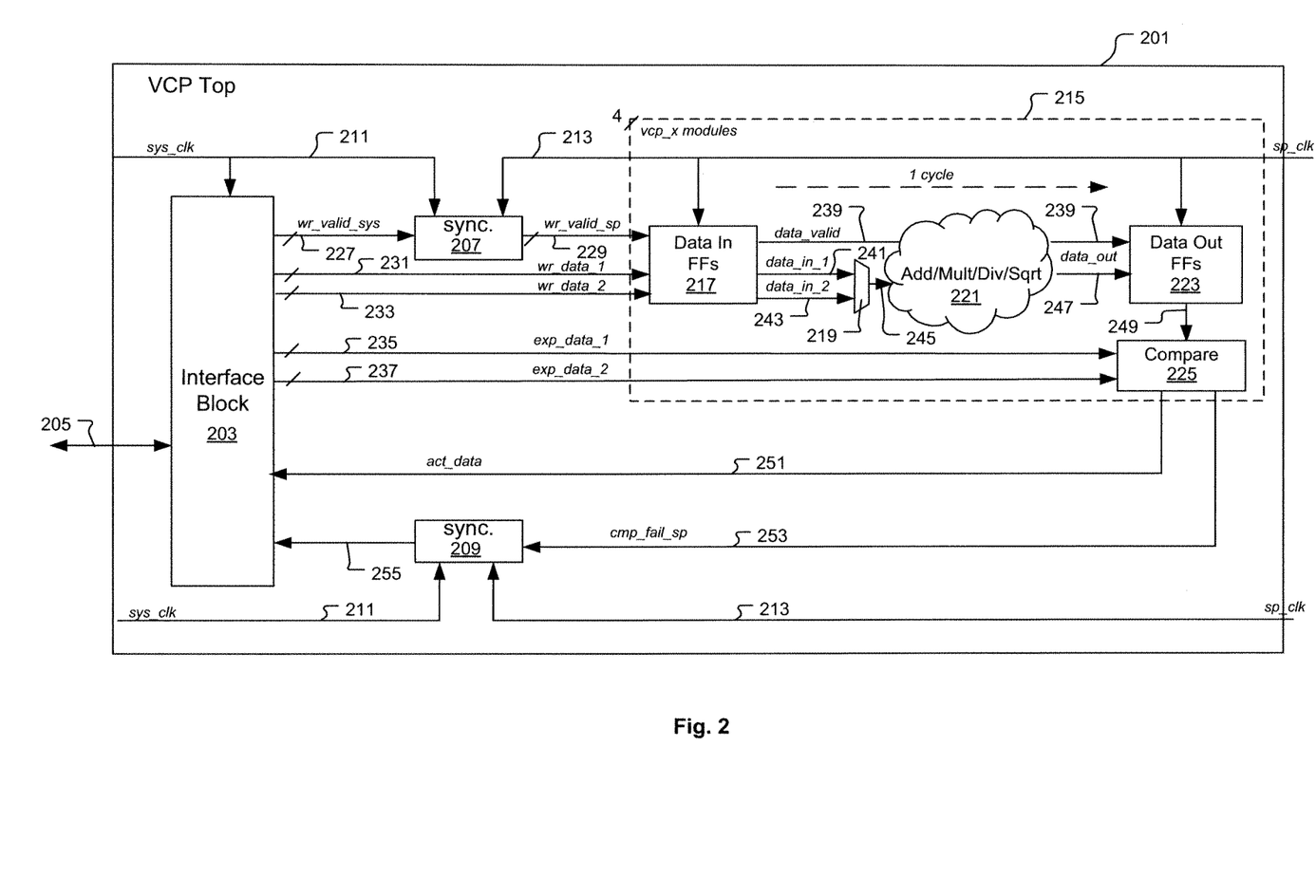
FIG. 2 shows a VCP system, in accordance with one embodiment of the present invention.

FIG. 2 shows a VCP system 201, in accordance with one embodiment of the present invention. The VCP system 201 is defined to emulate an actual critical path on the chip. And, the VCP system 201 is located on the chip near the actual critical path, such that the circuitry of the VCP system 201 will be subjected to similar process variation during manufacture as the actual critical path circuitry, and such that the VCP system 201 will be subjected to similar voltage and temperature conditions during operation as the actual critical path circuitry. The VCP system 201 is controlled through a set of dedicated registers located within an interface block 203. The interface block 203 operates in accordance with a system clock signal (sys_clk) 211, and is defined to store data for operating the VCP system 201. The interface block 203 is connected to transmit data to and receive data from the host chip within which the VCP system 201, as indicated by arrow 205. In one embodiment, the interface block 203 is defined as an advanced peripheral bus (APB) interface and is operated in accordance with a corresponding APB protocol. However, it should be understood that in other embodiments, the interface block 203 can be defined in other ways so long as the interface block 203 and the host chip are defined to operate in accordance with a mutually understood procedure/protocol.

The VCP system 201 also includes a number of VCP modules (vcp_x module) 215 defined to perform operations of emulating the signal timing performance of the actual critical path and determining whether or not the frequency of the clock signal used in the emulation is acceptable. In some embodiments, the VCP system 201 includes one VCP module (vcp_x module) 215. In some embodiments, the VCP system 201 includes multiple VCP modules (vcp_x module) 215. The VCP modules 215 are connected to operate in accordance with a special clock signal (sp_clk) 213. The special clock signal (sp_clk) 213 is generated separate from and independent from the system clock signal (sys_clk) 211. Therefore, the VCP system 201 is defined to operate in accordance with two different clock domains: 1) the system clock signal (sys_clk) 211 domain, and 2) the special clock signal (sp_clk) 213 domain. The special clock signal (sp_clk) 213 can be independently controlled to allow for emulation of the critical path within the VCP module 215, as different clock frequencies are applied to determine a maximum clock frequency at which the critical path can correctly operate. Each VCP module 215 can be defined to emulate a different critical path on the chip. Therefore, each VCP module 215 is separately and independently controllable. In following, each VCP module 215 can have its own special clock signal (sp_clk) 213 that is separately and independently controllable for its own use.

The VCP system 201 implements synchronization circuitry 207, 209 to synchronize transfer of various signals between the system clock signal (sys_clk) 211 domain and the special clock signal (sp_clk) 213 domain, so that data can be properly exchanged between the two clock domains. In one embodiment, the synchronization circuitry 207, 209 can include two back-to-back flip-flop circuits, each operating in a separate clock domain so that data from one clock domain can be transferred into the other clock domain, vice-versa. However, it should be understood that other embodiments can implement the synchronization circuitry 207, 209 in other ways so long as a given data signal in one clock domain can be correctly communicated to the other clock domain, vice-versa.

Each VCP module (vcp_x module) 215 includes data-in flip-flop circuits 217 for storing input data values, data-out flip-flop circuits 223 for storing output data values, and computational circuitry 221 connected to receive an input data value from the data-in flip-flop circuits 217, operate on the received input data value to generate an output data value, and transmit the output data to the data-out flip-flop circuits 223. More specifically, the data-in flip-flop circuits 217 are defined to receive and store a first input data value (wr_data_1) from the interface block 203, as indicated by connection 231. The data-in flip-flop circuits 217 are also defined to receive and store a second input data value (wr_data_2) from the interface block 203, as indicated by connection 233. And, the data-in flip-flop circuits 217 are defined to receive and store an enable signal (wr_valid_sp) from the interface block 203 by way of the synchronization circuitry 207, as indicated by connections 227 and 229. The enable signal (wr_valid_sp) is set by a user in a corresponding register in the interface block 203 as an enable signal (wr_valid_sys) in accordance with the system clock (sys_clk) 211. The synchronization circuitry 207 then transmits the enable signal (wr_valid_sys) to the special clock signal (sp_clk) 213 domain as the enable signal (wr_valid_sp). The enable signal (wr_valid_sp) indicates to the VCP module 215 that the required inputs are set and that operation of the VCP module 215 can commence. From the data-in flip-flop circuits 217, the enable signal (wr_valid_sp) is transmitted as an enable signal (data_valid) to the computational circuitry 221 and the data-out flip-flop circuits 223, as indicated by arrows 239.

The first input data value (wr_data_1) and the second input data value (wr_data_2) are set by the user within corresponding registers in the interface block 203. The first input data value (wr_data_1) and the second input data value (wr_data_2) are ultimately passed as inputs to the computational circuitry 221 in accordance with the special clock signal (sp_clk) 213. Specifically, the first input data value (wr_data_1 ) and the second input data value (wr_data_2) are respectively provided as a first input (data_in_1) and a second input (data_in_2) to a multiplexer 219, as indicated by arrows 241 and 243, respectively. The multiplexer 219 operates to alternate transmission of the first input (data_in_1) and the second input (data_in_2) as an input 245 to the computational circuitry 221 on successive cycles of the special clock signal (sp_clk) 213. In this manner, on each cycle of the special clock signal (sp_clk) 213, the computation circuitry 221 will receive as the input 245 a different one of the first input (data_in_1) and the second input (data_in_2) relative to a previous cycle of the special clock signal (sp_clk) 213. With the first input (data_in_1) and the second input (data_in_2) being different values, alternating between them as the input 245 to the computation circuitry 221 on successive cycles of the special clock signal (sp_clk) 213 will cause the logic gates within the computational circuitry 221 to change values (i.e., state) on each cycle of the special clock signal (sp_clk) 213, thereby causing an output value of the computational circuitry 221 to change on each cycle of the special clock signal (sp_clk) 213, thus preventing generation of false positive results in the event that the output value is different than the expected result value.

The computational circuitry 221 is defined to perform computational operations on the input 245 data value to generate an output data value (data_out) that is transmitted to the data-out flip-flop circuits 223, as indicated by arrow 247. The computational operations performed by the computational circuitry 221 can include any combination of mathematical operations, such as adding, dividing, multiplying, square root, among others. The computational circuitry 221 includes a combination of logic gates for implementing the combination of mathematical operations. The computational circuitry 221 is defined such that a signal timing characteristic of the computation circuitry 221 from receiving the input 245 to generating the output 247 is substantially similar to a signal timing characteristic of the actual critical path that the corresponding VCP module 215 is defined to emulate. In this manner, signal timing performance of the computational circuitry 221 in generating the output 247 is indicative of signal timing performance of the actual critical path in performing its function, even though the functions of the computational circuitry 221 and the actual critical path are different. Therefore, correct performance of the computational circuitry 221 in generating the output 247 for a given input 245 can be used to verify whether or not a frequency of the special clock signal (sp_clk) 213 can be safely applied to the system clock signal (sys_clk) 211 without causing a fault/error in operation of the actual critical path.

The output data value (data_out) generated by the computational circuitry 221 on a given cycle of the special clock signal (sp_clk) 213 is transmitted from the data-out flip-flop circuits 223 to comparison circuitry 225, as indicated by arrow 249. The comparison circuitry 225 is connected to receive as input from corresponding registers in the interface block 203 a first expected result value (exp_data_1) and a second expected result value (exp_data_2), as indicated by arrows 235 and 237, respectively. The first expected result value (exp_data_1) represents the correct output value when the first input data value (data_in_1) is processed through the computational operations of the computational circuitry 221. Similarly, the second expected result value (exp_data_2) represents the correct output value when the second input data value (data_in_2) is processed through the computational operations of the computational circuitry 221.

The comparison circuitry 225 is defined to determine whether or not the first expected result value (exp_data_1) matches the output value (data_out) generated based on processing of the first input data value (data_in_1) through the computational circuitry 221, in order to determine if the computational circuitry 221 functioned correctly. Similarly, the comparison circuitry 225 is defined to determine whether or not the second expected result value (exp_data_2) matches the output value (data_out) generated based on processing of the second input data value (data_in_2) through the computational circuitry 221, in order to determine if the computational circuitry 221 functioned correctly. Failure of the computational circuitry 221 to function correctly indicates that the frequency of the special clock signal (sp_clk) 213 was too high. If the comparison circuitry 225 determines that the generated output value (data_out) is correct, the frequency of the special clock signal (sp_clk) 213 as applied to the computational circuitry 221 in generating the output value (data_out) is acceptable.

If the comparison circuitry 225 determines that the generated output value (data_out) is not correct, the comparison circuitry 225 transmits a comparison failure signal (cmp_fail_sp) to synchronization circuitry 209, as indicated by arrow 253. Then, the synchronization circuitry 209 functions to write a comparison failure setting to a corresponding register within the interface block 203, in accordance with the system clock signal (sys_clk) 211, as indicated by arrow 255, thereby notifying the host chip that a maximum frequency of the special clock signal (sp_clk) 213 has been determined. Also, the output value (data_out) received as input by the comparison circuitry 225 is transmitted for storage in a corresponding register in the interface block 203, as indicated by arrow 251. In one embodiment, the VCP system 201 automatically stops operation when the comparison fails in the comparison circuitry 225. This automatic stopping of the VCP system 201 can be performed by resetting the enable signals (wr_valid_sp) and/or (wr_valid_sys).

In one embodiment, to operate the VCP system 201, the user loads the two input data values (wr_data_1) and (wr_data_2) into their registers in the interface block 203, and loads the two expected result values (exp_data_1) and (exp_data_2) into their registers in the interface block 203.

In another embodiment, the VCP system 201 includes logic for calculating the two expected result values (exp_data_1) and (exp_data_2) using a safe clock, i.e., a clock signal having a frequency that is set to ensure correct calculation of the two expected result values (exp_data_1) and (exp_data_2). In this embodiment, the user just provides the two input data values (wr_data_1) and (wr_data_2) into their registers in the interface block 203. Then, the user sets the enable signal (wr_valid_sys) to start operation of the VCP system 201. The VCP system 201 can be operated to programmatically increase the frequency of the special clock signal (sp_clk) 213 in order to determine a maximum frequency of the special clock signal (sp_clk) 213 at which the computational circuitry 221 can correctly operate, based on comparison of the generated output value (data_out) with the appropriate expected result value (exp_data_1/2) by the comparison circuitry 225.

In one embodiment, the user can increase the frequency of the special clock signal (sp_clk) 213 until the output value (data_out) is incorrect, thereby indicating that the maximum frequency of the special clock signal (sp_clk) 213 at which the computational circuitry 221 can correctly operate has been reached/exceeded. In other embodiments, the VCP system 201 can be controlled to implement different algorithms for adjusting the frequency of the special clock signal (sp_clk) 213 during operation of the VCP system 201 to determine the maximum frequency of the special clock signal (sp_clk) 213 at which the computational circuitry 221 can correctly operate. For example, in one embodiment, the VCP system 201 can be controlled to increment the frequency of the special clock signal (sp_clk) 213 on every other cycle of the special clock signal (sp_clk) 213. In another example, the VCP system 201 can be controlled to increment the frequency of the special clock signal (sp_clk) 213 on every tenth cycle of the special clock signal (sp_clk) 213. It should be understood that the frequency of the special clock signal (sp_clk) 213 can be adjusted in many different ways beyond the examples provided herein.

It should also be understood that the VCP system 201 can be operated without intervention by the processor of the host chip. Also, the VCP system 201 can be implemented within the programming model of the host chip. And, the special clock signal (sp_clk) 213 of the VCP system 201 is generated and controlled independent of the system clock signal (sys_clk) 211.

Based on the foregoing, it should be understood that the computational circuitry 221 of the VCP module 215 is defined to have a signal timing characteristic, e.g., delay, substantially equal to a signal timing characteristic of the actual critical path circuit which it emulates. Therefore, to define computational circuitry 221 for a given VCP module 215, STA analysis is performed on the actual critical path circuit to determine its timing characteristic. Then, the computational circuitry 221 is defined to have a timing characteristic that substantially matches the timing characteristic of the actual critical path, based on STA analysis of the computational circuitry 221. The VCP module 215 is then located on the chip as close as possible to the actual critical path circuit so that both the actual critical path circuit and its corresponding VCP module 215 will be subjected to similar process variation during manufacture of the chip, and will be subjected to similar voltage and temperature conditions during operation of the chip. In this manner, the signal timing performance of the computation circuitry 221 within the VCP module 215 should be representative of the signal timing performance of the actual critical path. Then, the VCP module 215 can be operated in accordance with the special clock signal (sp_clk) 213 to test whether or not higher clock frequencies can be successfully applied the actual critical path circuit, without interfering with the normal operation of the actual critical path circuit.

Figure 3:
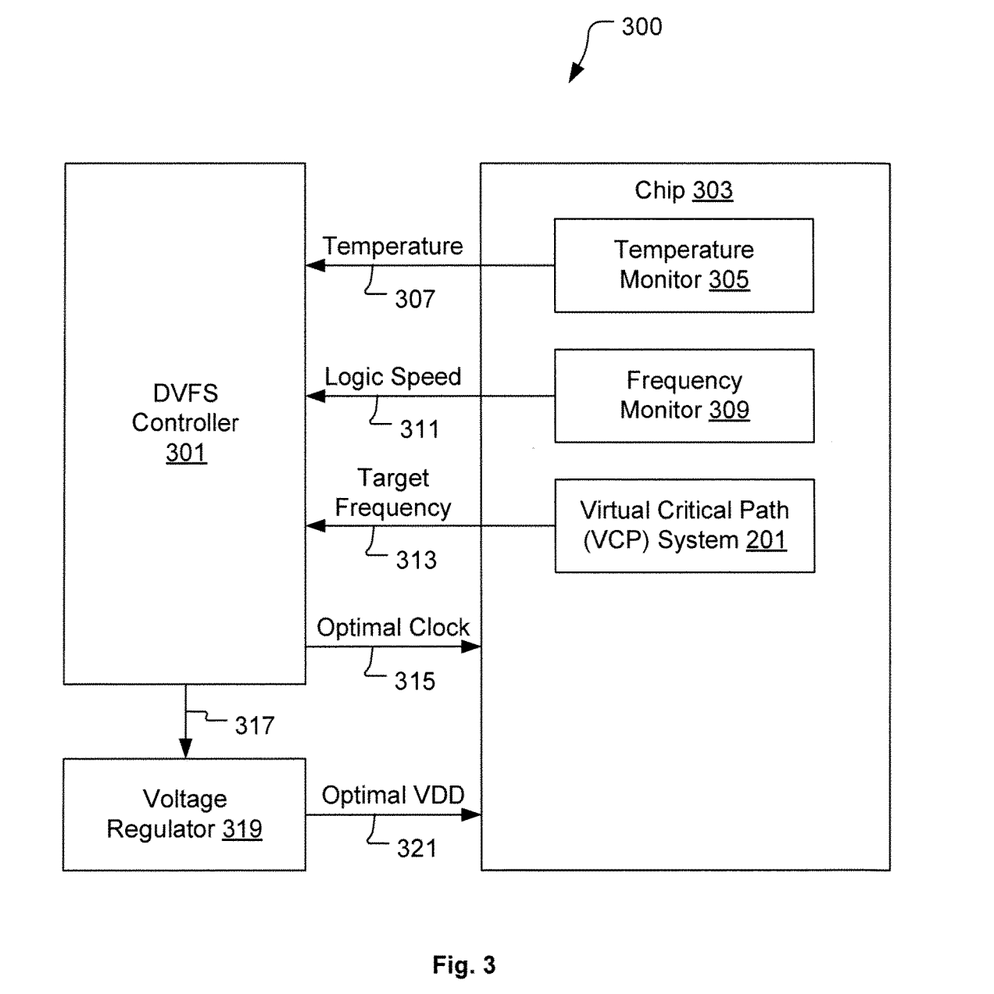
FIG. 3 shows a diagram of a VCP system implemented as a component within a dynamic voltage and frequency scaling (DVFS) system, in accordance with one embodiment of the present invention.

FIG. 3 shows a diagram of a VCP system (such as VCP system 201) implemented as a component within a dynamic voltage and frequency scaling (DVFS) system 300, in accordance with one embodiment of the present invention. The DVFS system 300 includes a DVFS controller 301 connected to receive input signal/data from a chip 303. The chip 303 can include a temperature monitor 305 connected to transmit temperature data as an input signal/data to the DVFS controller 301, as indicated by arrow 307. The chip 303 can also include a frequency monitor 309 connected to transmit system clock frequency data as an input signal/data to the DVFS controller 301, as indicated by arrow 311. The chip 303 can also include the VCP system 201 connected to transmit system clock target frequency data as an input signal/data to the DVFS controller 301, as indicated by arrow 313. The DVFS system 300 is also connected to control a voltage regulator 319, as indicated by arrow 317, which in turn supplies the operating voltage (VDD) to the chip 303 or supplies operating voltage to a particular block within the chip 303, as indicated by arrow 321.

In one embodiment, the VCP system 201 is operated to determine a maximum operational frequency at which the system clock can be safely set, given current voltage and temperature conditions on the chip 303, and given the process variation that occurred during manufacture of the chip 303. This maximum operational frequency is communicated to the DVFS controller 301 as the system clock target frequency data. The DVFS controller 301 can then operate to adjust the frequency of the system clock signal on the chip 303, as indicated by arrow 315, based on the system clock target frequency data determined by the VCP system 201.

A change in the supply voltage (VDD) can cause a change in the frequency of the system clock, which can impact performance of the chip 303. Therefore, if the supply voltage (VDD) changes for some reason, the VCP system 201 in conjunction with the DVFS controller 301 can be operated to readjust the system clock target frequency as necessary. It should be appreciated that with the VCP system 201 implemented in conjunction with the DVFS system 300, it is possible to use the results generated by the VCP system 201 to adjust the frequency and/or voltage of the chip 303 in real-time as the chip 303 is operating without causing operational failure of the chip 303.

The VCP system disclosed herein is scalable in that the number and/or type of VCP modules 215 on the chip can be easily expanded. The VCP system disclosed herein provides for on-chip detection of an over-clocking failure without impacting normal chip operation. The VCP system also saves the results associated with the over-clocking failure for reference by the user. The VCP system disclosed herein requires a small logic area on the chip, especially compared with the large logic area that would be required for cloning of a critical path on the chip. The VCP system can operate in parallel with normal operation of the chip and can send an interrupt signal to the processor on the chip to indicate when a maximum operational clock frequency has been determined. Therefore, the VCP system disclosed herein provides for testing of integrated circuit performance at higher clock frequencies without disrupting regular/normal operation of the chip. Also, the VCP system disclosed herein can be implemented with a user-friendly programming interface to allow for programming of VCP input data values into registers for use by the VCP system and to provide for control of the VCP system by the user. Use of the VCP system to determine the real-world maximum operating frequency for the system clock of a circuit may significantly improve performance, i.e., processing speed, of the circuit. For example, in some situations, use of the VCP system may allow for safely increasing the processing speed of a circuit by as much as 50%.

In view of the foregoing it should be understood that a virtual critical path circuit includes at least one input register for storing a programmable input value, computational circuitry defined to perform mathematical operations on the input value, at least one output register for storing an output value generated by the computational circuitry, and comparison circuitry defined to compare the output value to an expected result value to determine if the output value is correct. The computational circuitry is defined to operate in accordance with a special clock signal. The special clock signal is generated separate from a system clock signal. And, the computational circuitry is defined to have a signal timing characteristic substantially equivalent to a signal timing characteristic of a critical path circuit defined to operate in accordance with the system clock signal. A correct output value, as determined by the comparison circuitry, indicates that a frequency of the special clock signal is acceptable. An incorrect output value, as determined by the comparison circuitry, indicates that the frequency of the special clock signal is not acceptable.

It should be understood that the computational circuitry is defined separate from the critical path circuit. And, the computational circuitry operates independent of the critical path circuit. Therefore, operation of the computational circuitry does not interfere with operation of the critical path circuit. Likewise, operation of the comparison circuitry does not interfere with operation of the critical path circuit. Also, the comparison circuitry is defined to operate in accordance with the special clock signal. Synchronization circuitry is defined to synchronize transfer of signals between a domain of the system clock signal and a domain of the special clock signal. Additionally, the computational circuitry is located near the critical path circuit on a semiconductor chip, such that the computational circuitry and the critical path circuit are subject to similar process variation during manufacture, and such that the computational circuitry and the critical path circuit are subject to similar voltage and temperature during operation of the semiconductor chip.

Also, in view of the foregoing, it should be understood that in some embodiments the virtual critical path circuit includes a first input register for storing a programmable value of a first input value, and a second input register for storing a programmable value of a second input value, and a third input register for storing a programmable value of a first expected result value, and a fourth input register for storing a programmable value of a second expected result value. In these embodiments, the virtual critical path circuit also includes a multiplexer connected to receive as inputs the first and second input values from the first and second input registers. The multiplexer is defined to alternate submission of the first and second input values on successive cycles of the special clock signal as input to the computational circuitry. Also, in these embodiments, the comparison circuitry is defined to compare the output value to the first expected result value when the first input value is operated on by the computational circuitry. Similarly, the comparison circuitry is defined to compare the output value to the second expected result value when the second input value is operated on by the computational circuitry.

Further in view of the foregoing, it should be understood that an embodiment of the present invention includes a semiconductor chip within which a critical path circuit is defined and within which a virtual critical path circuit is defined. The critical path circuit is defined to operate in accordance with a system clock signal. And, the critical path circuit has a critical path signal timing characteristic. The virtual critical path circuit is defined to operate in accordance with a special clock signal. The virtual critical path circuit is defined separate from the critical path circuit. The special clock signal is generated separate from the system clock signal. The virtual critical path circuit is defined to have a virtual critical path signal timing characteristic substantially equal to the critical path signal timing characteristic.

The virtual critical path circuit includes computational circuitry defined to compute an output value based on an input value. The virtual critical path circuit also includes comparison circuitry defined to compare the output value computed by the computational circuitry with an expected result value associated with the input value. A match between the output value computed by the computational circuitry and the expected result value indicates that a frequency of the special clock signal is acceptable. A difference between the output value computed by the computational circuitry and the expected result value indicates that the frequency of the special clock signal is not acceptable.

In some embodiments, the virtual critical path circuit is defined to direct the computational circuitry to compute a first output value based on a first input value and to compute a second output value based on a second input value in an alternating manner in accordance with successive cycles of the special clock signal. Also, the virtual critical path circuit includes special clock signal control circuitry defined to increase the frequency of the special clock signal between different operations of the computational circuitry to compute the output value based on the input value so as to determine a maximum acceptable frequency of the special clock signal. The maximum acceptable frequency of the special clock signal is a largest frequency of the special clock signal that provides for correct computation of the output value by the computational circuitry based on comparison of the output value with the expected result value.

The virtual critical path circuit includes circuitry for communicating a determined value of the maximum acceptable frequency of the special clock signal to system clock signal control circuitry to enable the adjustment of a frequency of the system clock signal to match the maximum acceptable frequency of the special clock signal. The virtual critical path circuit includes synchronization circuitry defined to synchronize transfer of signals between a domain of the system clock signal and a domain of the special clock signal.

It should be understood that the computational circuitry is defined separate from the critical path circuit. And, the computational circuitry operates independent of the critical path circuit. To the extent possible, the computational circuitry is located near the critical path circuit on the semiconductor chip such that the computational circuitry and the critical path circuit are subject to similar process variation during manufacture, and such that the computational circuitry and the critical path circuit are subject to similar voltage and temperature during operation of the semiconductor chip.

Figure 4:
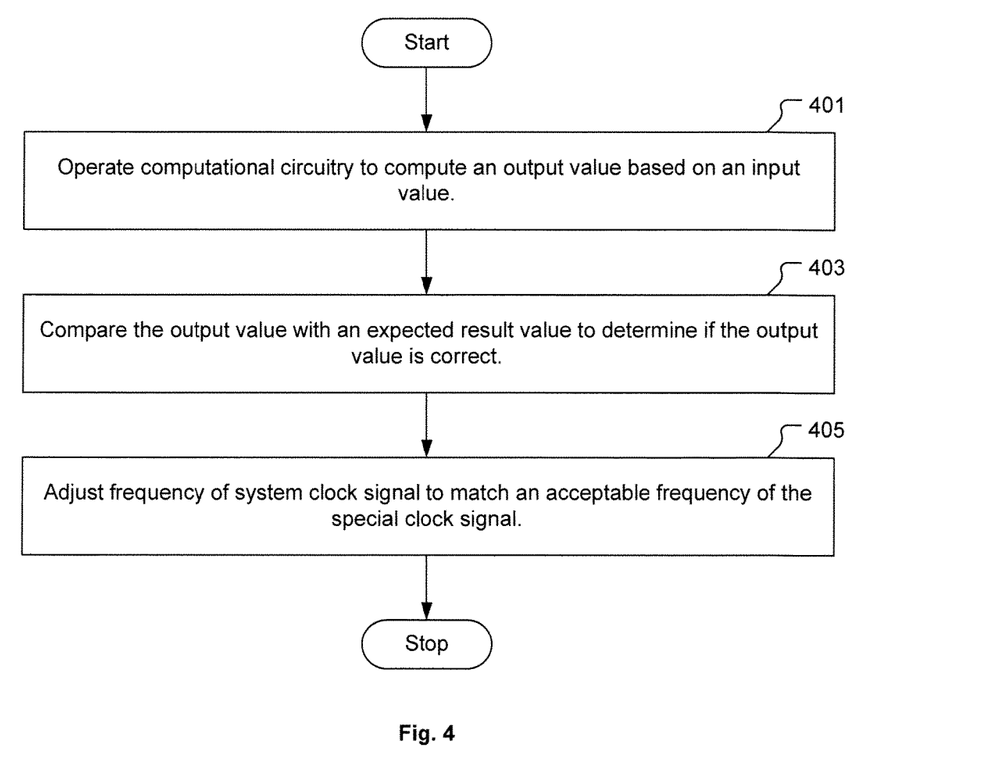
FIG. 4 shows a flowchart of a method for real-time system clock optimization, in accordance with one embodiment of the present invention.

FIG. 4 shows a flowchart of a method for real-time system clock optimization, in accordance with one embodiment of the present invention. The method includes an operation 401 for operating computational circuitry to compute an output value based on an input value. The computational circuitry is operated in accordance with a special clock signal. The computational circuitry has a signal timing characteristic substantially equivalent to a signal timing characteristic of a critical path circuit defined to operate in accordance with a system clock signal. The special clock signal is generated separate from the system clock signal. Also, the computational circuitry is operated independent from the critical path circuit. The method also includes an operation 403 for comparing the output value with an expected result value to determine if the output value is correct. A correct output value indicates that a frequency of the special clock signal is acceptable. An incorrect output value indicates that the frequency of the special clock signal is not acceptable. The method also includes an operation 405 for adjusting a frequency of the system clock signal to match an acceptable frequency of the special clock signal. To an extent possible the computational circuitry is located near the critical path circuit on a semiconductor chip such that the computational circuitry and the critical path circuit are subject to similar process variation during manufacture, and such that the computational circuitry and the critical path circuit are subject to similar voltage and temperature during operation of the semiconductor chip.

The method can also include an operation for increasing a frequency of the special clock signal for successive operation of the computation circuitry to compute the output value based on the input value and comparison of the output value with the expected result value. The frequency of the special clock signal is increased to determine a maximum acceptable frequency of the special clock signal. The maximum acceptable frequency of the special clock signal is a largest frequency of the special clock signal that provides for correct computation of the output value by the computational circuitry based on comparison of the output value with the expected result value. The method can also include an operation for alternating between a first input value and a second input value between successive cycles of the special clock signal, and alternating between a first expected result value and a second expected result value between successive cycles of the special clock signal, such that the first input value and the first expected result value are used on a same cycle of the special clock signal and such that the second input value and the second expected result value are used on a same cycle of the special clock signal.

The method can also include an operation for loading the first input value, the second input value, the first expected result value, and the second expected result value into registers for access in operating the computational circuitry to compute the output value based on the input value and for access in comparing the output value with the expected result value. And, the method can also include an operation for adjusting the frequency of the system clock signal to match the maximum acceptable frequency of the special clock signal upon determining the maximum acceptable frequency of the special clock signal. The method can include an operation for synchronizing transfer of signals between a domain of the system clock signal and a domain of the special clock signal to facilitate loading of the first input value, the second input value, the first expected result value, and the second expected result value, and to facilitate communication of the maximum acceptable frequency of the special clock signal to a controller of the system clock signal to enable adjustment of the frequency of the system clock signal to match the maximum acceptable frequency of the special clock signal.

The VCP system disclosed herein can be represented as circuit data embodied as computer readable code on a non-transitory computer readable medium. The non-transitory computer readable medium mentioned herein is any data storage device that can store data which can thereafter be read by a computer system. Examples of the non-transitory computer readable medium include hard drives, network attached storage (NAS), read-only memory, random-access memory, CD-ROMs, CD-Rs, CD-RWs, solid-state digital data storage devices, magnetic tapes, and other optical and non-optical data storage devices. The non-transitory computer readable medium can also be multiple data storage devices distributed over a network of coupled computer systems so that the computer readable code is stored, accessed, and/or executed in a distributed fashion.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

The embodiments of the present invention can also be defined as a machine that transforms data from one state to another state. The data may represent an article, that can be represented as an electronic signal and electronically manipulate data. The transformed data can, in some cases, be visually depicted on a display, representing the physical object that results from the transformation of data. The transformed data can be saved to storage generally, or in particular formats that enable the construction or depiction of a physical and tangible object. In some embodiments, the manipulation can be performed by a processor. In such an example, the processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

It should be further understood that the VCP system as disclosed herein can be manufactured as part of a semiconductor device or chip. In the fabrication of semiconductor devices such as integrated circuits, memory cells, and the like, a series of manufacturing operations are performed to define features on a semiconductor wafer. The wafer includes integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Furthermore, each type of memory device may have different configurations. For example, flash memory devices may be configured in a NAND or a NOR configuration. It should be understood that the VCP system as disclosed herein can be implemented in conjunction with any circuitry, and in particular with the circuitry of the semiconductor memory devices referred to herein.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or such that each element is individually accessible. By way of non-limiting example, NAND devices contain memory elements (e.g., devices containing a charge storage region) connected in series. For example, a NAND memory array may be configured so that the array is composed of multiple strings of memory in which each string is composed of multiple memory elements sharing a single bit line and accessed as a group. In contrast, memory elements may be configured so that each element is individually accessible, e.g., a NOR memory array. One of skill in the art will recognize that the NAND and NOR memory configurations are exemplary, and memory elements may be otherwise configured.

The semiconductor memory elements of a single device, such as elements located within and/or over the same substrate or in a single die, may be distributed in two or three dimensions, such as a two dimensional array structure or a three dimensional array structure.

In a two dimensional memory structure, the semiconductor memory elements are arranged in a single plane or single memory device level. Typically, in a two dimensional memory structure, memory elements are located in a plane (e.g., in an x-z direction plane) which extends substantially parallel to a major surface of a substrate that supports the memory elements. The substrate may be a wafer over which the layers of the memory elements are deposited and/or in which memory elements are formed or it may be a carrier substrate which is attached to the memory elements after they are formed.

The memory elements may be arranged in the single memory device level in an ordered array, such as in a plurality of rows and/or columns. However, the memory elements may be arranged in non-regular or non-orthogonal configurations as understood by one of skill in the art. The memory elements may each have two or more electrodes or contact lines, such as bit lines and word lines.

A three dimensional memory array is organized so that memory elements occupy multiple planes or multiple device levels, forming a structure in three dimensions (i.e., in the x, y and z directions, where the y direction is substantially perpendicular and the x and z directions are substantially parallel to the major surface of the substrate).

As a non-limiting example, each plane in a three dimensional memory array structure may be physically located in two dimensions (one memory level) with multiple two dimensional memory levels to form a three dimensional memory array structure. As another non-limiting example, a three dimensional memory array may be physically structured as multiple vertical columns (e.g., columns extending substantially perpendicular to the major surface of the substrate in the y direction) having multiple elements in each column and therefore having elements spanning several vertically stacked memory planes. The columns may be arranged in a two dimensional configuration, e.g., in an x-z plane, thereby resulting in a three dimensional arrangement of memory elements. One of skill in the art will understand that other configurations of memory elements in three dimensions will also constitute a three dimensional memory array.

By way of non-limiting example, in a three dimensional NAND memory array, the memory elements may be connected together to form a NAND string within a single horizontal (e.g., x-z) plane. Alternatively, the memory elements may be connected together to extend through multiple horizontal planes. Other three dimensional configurations can be envisioned wherein some NAND strings contain memory elements in a single memory level while other strings contain memory elements which extend through multiple memory levels. Three dimensional memory arrays may also be designed in a NOR configuration and in a ReRAM configuration.

A monolithic three dimensional memory array is one in which multiple memory levels are formed above and/or within a single substrate, such as a semiconductor wafer. In a monolithic three dimensional array the layers of each level of the array are formed on the layers of each underlying level of the array. One of skill in the art will understand that layers of adjacent levels of a monolithic three dimensional memory array may be shared or have intervening layers between memory levels. In contrast, two dimensional arrays may be formed separately and then packaged together to form a non-monolithic memory device. For example, non-monolithic stacked memories have been constructed by forming memory levels on separate substrates and adhering the memory levels atop each other. The substrates may be thinned or removed from the memory levels before bonding, but as the memory levels are initially formed over separate substrates, such memories are not monolithic three dimensional memory arrays. Further, multiple two dimensional memory arrays or three dimensional memory arrays (monolithic or non-monolithic) may be formed separately and then packaged together to form a stacked-chip memory device.

One of skill in the art will recognize that this invention is not limited to the two dimensional and three dimensional exemplary structures described but cover all relevant memory structures within the spirit and scope of the invention as described herein and as understood by one of skill in the art.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A semiconductor chip, comprising:
   a critical path circuit comprising first circuitry defined between an input latch and an output latch, defined to operate in accordance with a system clock signal, wherein:
      the first circuitry is configured to perform first logic functions on input data from the input latch to generate output data at the output latch, and
      a critical path timing characteristic of the critical path circuit is defined as a time delay from clocking out of the input data from the input latch to clocking in of the output data into the output latch; and
   a virtual critical path circuit comprising second circuitry defined to operate in accordance with a special clock signal, wherein:
      the second circuitry is configured to perform second logic functions on an input value to generate an output value,
      a virtual critical path timing characteristic of the virtual critical path circuit corresponds to a duration extending from receipt of the input value by the second circuitry to generation of the output value by the second circuitry, the second circuitry configured such that the virtual critical path timing characteristic is substantially equal to the critical path timing characteristic, and
      the second logic functions performed on the input value by the second circuitry to generate the output value are different from the first logic functions performed on the input data by the first circuitry to generate the output data;
   the virtual critical path circuit further comprising comparison circuitry configured to compare the output value computed by the second circuitry with an expected result value associated with the input value to determine whether a frequency of the special clock signal is acceptable.

2. The semiconductor chip as recited in claim 1, wherein the virtual critical path circuit includes special clock signal control circuitry defined to increase the frequency of the special clock signal between different operations of the second circuitry to compute the output value based on the input value so as to determine a maximum acceptable frequency of the special clock signal, wherein the maximum acceptable frequency of the special clock signal is a largest frequency of the special clock signal that provides for correct computation of the output value by the second circuitry based on comparison of the output value with the expected result value.

3. The semiconductor chip as recited in claim 2, wherein the virtual critical path circuit is defined to direct the second circuitry to compute a first output value based on a first input value and to compute a second output value based on a second input value in an alternating manner in accordance with successive cycles of the special clock signal.

4. The semiconductor chip as recited in claim 3, wherein the virtual critical path circuit includes circuitry for communicating a determined value of the maximum acceptable frequency of the special clock signal to system clock signal control circuitry to enable the adjustment of a frequency of the system clock signal to match the maximum acceptable frequency of the special clock signal.

5. The semiconductor chip as recited in claim 4, wherein the virtual critical path circuit includes synchronization circuitry defined to synchronize transfer of signals between a domain of the system clock signal and a domain of the special clock signal.

6. The semiconductor chip as recited in claim 1, wherein the second circuitry is defined separate from the critical path circuit, and wherein the second circuitry operates independent of the critical path circuit.

7. The semiconductor chip as recited in claim 6, wherein the second circuitry is located near the critical path circuit on the semiconductor chip such that the second circuitry and the critical path circuit are subject to similar process variation during manufacture, and such that the second circuitry and the critical path circuit are subject to similar voltage and temperature during operation of the semiconductor chip.

8. The semiconductor chip as recited in claim 1, wherein the virtual critical path circuit includes data-in flip-flop circuits configured to receive and store a first input data value and a second input data value, the second circuitry defined to perform computational operations on the first input data value and the second input data value in an alternating manner on successive cycles of the special clock signal.

9. The semiconductor chip as recited in claim 8, wherein the virtual critical path circuit includes a multiplexer configured to receive the first input data value and the second input data value as separate inputs, the multiplexer configured to transmit the first input data value and the second input data value as the input value to the second circuitry on successive cycles of the special clock signal.

10. The semiconductor chip as recited in claim 9, wherein the virtual critical path circuit includes data-out flip-flop circuits configured to receive and store a first output data value and a second output data value from the second circuitry, the first output data value generated by the second circuitry operating on the first input data value, the second output data value generated by the second circuitry operating on the second input data value.

11. The semiconductor chip as recited in claim 10, wherein the comparison circuitry is configured to receive the first output data value and the second output data value from the data-out flip-flop circuits, the comparison circuitry configured to compare the first output data value to a first expected result value to determine whether or not the second circuitry functioned correctly when processing the first input data value, the comparison circuitry configured to compare the second output data value to a second expected result value to determine whether or not the second circuitry functioned correctly when processing the second input data value.

12. The semiconductor chip as recited in claim 11, wherein the comparison circuitry is configured to transmit a comparison failure signal when the first output data value does not equal the first expected result value, and wherein the comparison circuitry is configured to transmit the comparison failure signal when the second output data value does not equal the second expected result value.

13. The semiconductor chip as recited in claim 1, wherein the second circuitry is configured to perform mathematical operations on the input value to generate the output value.

14. A method comprising:
operating a virtual critical path circuit defined to operate in accordance with a special clock signal, separate from a system clock signal of a critical path circuit, the critical path circuit comprising first circuitry defined between an input latch and an output latch, the first circuitry configured to perform first logic functions on input data transmitted from the input latch to generate output data at the output latch, the critical path circuit having a critical path timing characteristic defined as a time delay from clocking out of the input data from the input latch to clocking in of the output data into the output latch, the virtual critical path circuit comprising second circuitry configured to perform second logic functions on an input value to generate an output value, wherein:
the second logic functions performed by the second circuitry of the virtual critical path circuit on the input value to generate the output value differ from the first logic functions performed by the first circuitry of the critical path circuit,
the virtual critical path circuit has a virtual critical path timing characteristic corresponding to a duration extending from receipt of an input value by the second circuitry to generation of a corresponding output value by the second circuitry, the second circuitry configured such that the virtual critical path timing characteristic is substantially equal to the critical path timing characteristic, and
wherein operating the virtual critical path circuit further comprises:
comparing the output value generated by the second circuitry with an expected result value associated with the input value to determine that a frequency of the special clock signal is acceptable for operation of the critical path circuit; and
adjusting a frequency of the system clock signal to match the determined acceptable frequency of the special clock signal.

15. The method as recited in claim 14, further comprising:
increasing a frequency of the special clock signal for successive operation of the second circuitry to compute the output value based on the input value and comparison of the output value with the expected result value, the frequency of the special clock signal increased to determine a maximum acceptable frequency of the special clock signal, wherein the maximum acceptable frequency of the special clock signal is a highest frequency of the special clock signal that provides for correct computation of the output value by the second circuitry based on comparison of the output value with the expected result value.

16. The method as recited in claim 15, further comprising:
alternating between a first input value and a second input value between successive cycles of the special clock signal; and
alternating between a first expected result value and a second expected result value between successive cycles of the special clock signal, such that the first input value and the first expected result value are used on a same cycle of the special clock signal and such that the second input value and the second expected result value are used on a same cycle of the special clock signal.

17. The method as recited in claim 16, further comprising:
upon determining the maximum acceptable frequency of the special clock signal, adjusting the frequency of the system clock signal to match the maximum acceptable frequency of the special clock signal.

18. The method as recited in claim 17, further comprising:
synchronizing transfer of signals between a domain of the system clock signal and a domain of the special clock signal.

19. The method as recited in claim 16, further comprising:
loading the first input value, the second input value, the first expected result value, and the second expected result value into registers for access in operating the second circuitry to compute the output value based on the input value and for access in comparing the output value with the expected result value.

20. The method as recited in claim 14, wherein the second circuitry is located near the critical path circuit on a semiconductor chip such that the second circuitry and the critical path circuit are subject to similar process variation during manufacture, and such that the second circuitry and the critical path circuit are subject to similar voltage and temperature during operation of the semiconductor chip. second circuitry functioned correctly when processing the second input data value.

* * * * *